United States Patent
Kobayashi et al.

(10) Patent No.: US 6,779,264 B2
(45) Date of Patent: Aug. 24, 2004

(54) ELECTRONIC DEVICE

(75) Inventors: Takeshi Kobayashi, Tochigi (JP);
Hideki Fukazawa, Tochigi (JP);
Satoshi Utsunomiya, Tochigi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/415,121

(22) Filed: Oct. 8, 1999

(65) Prior Publication Data

US 2002/0130405 A1 Sep. 19, 2002

(30) Foreign Application Priority Data

Nov. 19, 1998 (JP) .......................... 10-329889

(51) Int. Cl.[7] .............................................. H01R 43/00
(52) U.S. Cl. ......................... 29/856; 29/854; 29/827;
29/855; 174/52.2; 174/52.4; 257/676; 257/692;
257/693; 257/696; 361/773
(58) Field of Search ................... 174/52.2, 52.4;
257/676, 692, 693, 696; 361/773; 29/827,
854, 855, 856

(56) References Cited

U.S. PATENT DOCUMENTS

| | | | |
|---|---|---|---|
| 4,805,009 A | 2/1989 | Pryor et al. ................ | 257/729 |
| 4,857,483 A | * 8/1989 | Steffen et al. ............. | 257/668 |
| 5,172,214 A | 12/1992 | Casto | |
| 5,349,238 A | * 9/1994 | Ohsawa et al. ............ | 257/666 |
| 5,508,557 A | 4/1996 | Sunada .................... | 257/692 |
| 5,625,223 A | 4/1997 | Sunada .................... | 257/693 |
| 5,744,868 A | 4/1998 | Cozar et al. .............. | 257/767 |
| 5,894,108 A | 4/1999 | Mostafazadeh et al. | |
| 5,917,241 A | * 6/1999 | Nakayama et al. ......... | 257/728 |
| 6,277,225 B1 | * 8/2001 | Kinsman et al. ........... | 156/196 |

FOREIGN PATENT DOCUMENTS

| | | |
|---|---|---|
| EP | 0 829 455 A2 | 3/1998 |
| JP | 63-239851 | 10/1988 |
| JP | 4-206764 | 7/1992 |
| JP | 5-47954 | 2/1993 |
| JP | 7-312405 | 11/1995 |
| JP | 10-303358 | 11/1998 |
| JP | 11-58449 | 3/1999 |

OTHER PUBLICATIONS

1989, Van Nostrand Reinhold, "Microelectronics Packaging Handbook", p. 548.
Oct. 27, 2000, European Search Report for application No. EP 99 12 0581.

* cited by examiner

*Primary Examiner*—Richard Chang
(74) *Attorney, Agent, or Firm*—Merchant & Gould P.C.

(57) ABSTRACT

A method for manufacturing an electronic device by placing within a die a first lead with an element placement pad, a second lead, and an electronic element placed on the element placement pad. The electronic element, the element placement pad, a part of the first lead, and a part of the second lead are sealed in a package by injecting a sealing resin in the die from a position on a longer side of the package, with the position being offset toward one shorter side thereof. The first lead is bent in an S shape, with a bending depth being at least as large as the thickness of the first lead. A thickness of the resin on a non-device side of the element placement pad is smaller than the bending depth.

7 Claims, 4 Drawing Sheets

ELECTRONIC DEVICE

BACKGROUND OF THE INVENTION

1. Field of the Invention

The present invention relates to a resin-sealed surface mount electronic device.

2. Description of the Prior Art

With reductions in the size of electronic equipment, there has been an increase in the use of surface mount semiconductor devices, such as diodes and transistors, and the size of these devices also is being reduced.

FIG. 3 shows the general construction of a surface mount diode of the past, FIG. 3(A) being a plan view thereof, and FIG. 3(B) being a cross-section view as seen from the direction indicated by the arrows along the line II—II in FIG. 3(A).

The electronic device 100 of FIG. 3 has a first external lead 110, which has a electronic element placement pad (die pad) 111 for placement of an electronic element, and a second external lead 120, which is disposed at a distance from the element placement pad 111. A semiconductor element 130 is placed on the element placement pad 111. A bonding wire 150 makes a connection between an external connection terminal of the semiconductor element 130 and the second external lead 120. The semiconductor element 130, the electronic element placement pad 111, the inner lead part of the first external lead 110, the inner lead part of the second external lead 120, and the bonding wire 150 are sealed by a sealing resin 140. As shown in this drawing, the first external lead 110 and the second external lead 120 are bent in an S shape, with one end of the leads 110 and 120 exposed to the outside of the sealing resin 140, so as to form outer lead parts. The lower surfaces of the outer leads extend in a direction that is substantially parallel to the bottom surface 141 of the sealing resin 140, and are substantially on the same plane as the bottom surface 141 of the sealing resin 140.

The above-noted electronic device is manufactured by first punching out and bending a thin metal sheet to the appropriate shape to form a lead frame, onto which the semiconductor device is placed. Then, after making the prescribed connections, the device is sealed using sealing resin. The sealing with the sealing resin 140 is done within a die of the prescribed shape, so as to include the electronic element placement pad 111, the inner lead part of the first external lead 110, and the inner lead part of the second external lead 120, resin being injected via a resin injection port 190, indicated by the double-dot-dash line, on one of the shorter sides of the device.

The dimensions of a usual resin sealed electronic device of the past were approximately a vertical dimension (X-axis dimension $L_X$ in FIG. 3) of 1.3 mm, a horizontal dimension (Y-axis dimension $L_Y$ in FIG. 3) of 0.8 mm, and a height (Z-axis dimension H in FIG. 3) of 0.7 mm.

Because the thickness of the lead frame used in an electronic device of the past was 0.1 mm or greater, however, it was difficult to achieve a surface mount electronic device with a resin package having all of the vertical, horizontal, and height dimensions smaller than approximately 1 mm, including resin-sealed semiconductor devices making use of a semiconductor substrate.

Because the thickness of the lead frame is 0.1 mm or greater, the spacing between the element placement pad 111 of the first external lead 110 and the second external lead 120 grows to over 0.2 mm by the formation of the lead. Because of the relationship between such parameters as the lead bending depth, the associated thickness of the resin at the bottom of the element placement pad 111 that is required therefor, the lead length required for bending, and the establishment of a flat surface for placement of an element, in the case of diodes in particular, it was not possible to achieve a vertical length of less than 1.0 mm.

As electronic devices became smaller, because of the delicate bending shape of the bent parts 112 and 122 near the bottom surface of the sealing resin of the external leads, there was a tendency toward such problems as insufficiencies in the adhesion and filling in of sealing resin, the strength of the lead itself, and the adhesive strength between the lead and the sealing resin, and poor adhesion and filling in of solder used for mounting, and it was difficult to achieve an electronic component that provided improvements in these deficiencies.

SUMMARY OF THE INVENTION

Accordingly, it is an object of the present invention to provide an electronic device that solves the problems of the limitation in size reduction of surface mount resin sealed electronic devices in the past, and to enable the achievement of an electronic device having a resin package with vertical, horizontal, and height dimensions that are all below 1 mm.

It is another object of the present invention to provide a resin sealed surface mount electronic device that, even with a reduction in size of the electronic device, provides good filling in of sealing resin to the bent parts near the bottom surface of the sealing resin of the external leads, good adhesion strength between the leads and the sealing resin, and good strength in the leads themselves, and further providing good adhesion and filling in of solder when the device is mounted.

To achieve the above-noted object, the present invention has the following constitution.

Specifically, a first aspect of an electronic device according to the present invention has an electronic element, a first external lead with an element placement pad having a thickness t of less than 0.1 mm, and a second external lead that is disposed at a distance from the above-noted element placement pad, wherein the electronic element, the element placement pad, part of the first external lead, and part of the second external lead are sealed with a sealing resin, the first external lead being bent in an S shape, the bending depth d thereof being at least as large as the thickness t of the first external lead, and the thickness T of the resin on the non-device side of the element placement pad being smaller than the bending depth d.

In the first aspect of an electronic device of the present invention, the first external lead thickness t, the relationship of this thickness t to the bending depth d, and the relationship between the sealing resin thickness T at the bottom of the element placement pad and the bending depth d are established. By doing this, it is possible to limit the height of the electronic device, and to achieve the flat area required in the element placement pad. Additionally, because the spacing between the element placement pad and the second external lead can be made short, it is possible to reduce the dimension in the vertical direction.

In the configuration of the above-noted first aspect of the present invention, it is preferable that the spacing between the element placement pad and the second external lead be made no greater than 0.12 mm. Using this preferable configuration, it is possible to make a further reduction in the vertical-direction dimension of the electronic device.

In the above-noted configuration, it is preferable that the outer vertical, horizontal, and height dimensions of the sealing resin all be no greater than 1.0 mm. Using this preferable configuration, it is possible to achieve a compact electronic device that was not possible to achieve in the past, thereby contributing to the reduction in size of electronic equipment.

In the first aspect of the present invention, it is preferable that the width of the inner lead parts of the first and second external leads within the sealing resin be of a substantially uniform width and not broaden beyond the exposed part. Using this preferable configuration, it is possible to obtain a compact electronic device having a width (Y-direction dimension) that does not become large. The effect of reducing the package size is particularly significant in the case in of an electronic device having three or more terminals.

In the above-noted configuration, it is preferable that the thickness of the electronic element be substantially the same as the thickness t of the first external lead. Using this preferable configuration, it is possible to make the height of the bonding wire the same as that of the chip.

In the above-noted first aspect of the present invention, it is preferable that the sealing resin be injected from a position on either of the longer sides that is offset towards a shorter side. By providing a sealing resin injection port at such a position, the injected resin extends well into the package die, without a tendency toward the formation of eddies and/or accumulations, thereby preventing problems with insufficient sealing resin filling.

In the first aspect of the present invention, it is preferable that the bending radius R of outer surface of the bent part of the first external lead in the region of the sealing resin bottom surface be at least 0.05 mm, but no greater than the lead thickness t. Using this preferable configuration, it is possible not only to prevent both constriction of material and lead bending during lead formation, but also to achieve flexibility of the frame with respect to stress that is applied in downstream processes.

In the first aspect of the present invention, it is preferable that the sealing resin includes filler that has a particle diameter that is no greater than half the bending depth d of the lead. This preferred configuration facilitates the filling in of sealing resin and filler at the lower surface of the bent lead, thereby maintaining sufficient formation strength.

The second aspect of an electronic device according to the present invention has an electronic element, a first external lead with an element placement pad having a thickness t of less than 0.1 mm, and a second external lead that is disposed at a distance from the above-noted element placement pad, wherein the electronic element, the element placement pad, part of the first external lead, and part of the second external lead are sealed with a sealing resin, the first external lead and second external lead being bent at the bottom surface of the sealing resin, extending in a direction that is substantially parallel to the bottom surface of the sealing resin and being exposed. A depression is formed in the bottom surface part of the bent part of the first external lead and the second external lead, at which depression the thickness of the lead is reduced, the bottom surfaces of the depressions of the first and second external leads and the bottom surface of the sealing resin being formed so as to be higher than the lowermost surfaces of the parts of the first and second external leads which extend outside.

According to the above-noted second aspect of the present invention, by providing a depression in the bottom surfaces of the bent parts of the first and second external leads, good filling of sealing resin is achieved in the region of the bent parts, thereby improving the adhesion strength between the leads and the sealing resin, another effect being an improvement in the strength of the leads themselves. Because the bottom surfaces of the depressions and the bottom surface of the sealing resin are formed so as to be higher than the lowermost surfaces of the parts of the first and second external leads which extend outside, good adhesion and filling of solder is achieved when mounting the device to a circuit board.

In the second aspect of the present invention, it is preferable that the depression be formed within the projected boundaries of the sealing resin as seen from above. By adopting this preferred configuration, the design of the shape in the region of the depression of the resin die used for resin sealing is facilitated, and it is easy to prevent leakage of sealing resin from the area surrounding the depression when resin sealing is done. Additionally, because the formation of the depression is accompanied by a reduction in the thickness of the lead, by forming the depression within the above-noted region, it is possible to compensate for the loss of strength caused by this accompanying reduction in lead thickness by means of sealing resin in the surrounding area. Additionally, because it is possible to form the lowermost surfaces of the first and second external leads within the region that is projected from above the sealing resin, it is possible to achieve a sufficient contact surface area between the circuit board and the leads, even if the exposed parts of the first and second external leads are shortened. It is therefore possible to reduce the mounting surface area of the electronic component, thereby contributing to a reduction in size of the overall electrical equipment.

In the second aspect of the present invention, it is preferable that a sealing resin escape part be formed at the side bottom part of the sealing resin, and that bottom edge position of this escape part be substantially the same as the forming position of the depression, and that the distances between these positions and the border with the above-noted region projected from above the sealing resin both be no greater than the thickness of the lead. By forming a sealing resin escape part at the at the bottom side part of the sealing resin, removal from the resin die after resin sealing is facilitated. By making the formation position of the depression substantially the same as the bottom edge position of the escape part, it is possible to form the lowermost surfaces of the first and second external leads within a region projected from above the sealing resin. As a result, even if the parts of the first and second external leads that are exposed from the sealing resin are made short, it is possible to achieve a sufficient contact surface area between the circuit board and the leads. This enables a reduction in the size of the mounting surface area of the electronic component, therefore contributing to the reduction in size of the electronic equipment. Additionally, because the distances from the border of the region projected from above the sealing resin to the bottom edge position of the escape part and the formation position of the depression are both no greater than the lead thickness, it is possible to optimize the reduction in the device size, the lead bending angle, and the sealing resin thickness at the bottom of the element placement pad, while achieving a sufficient element placement pad.

In the second aspect of the present invention, it is preferable that the lower surfaces of the first and second external leads have a flat part that protrudes beyond the depression, within the projected boundaries of the sealing resin as seen from above. By doing this, the flat parts formed on the lower surfaces of the first and second external leads serve as the contact surfaces with the circuit board, these contact surface being inside the region projected from above the sealing resin, so that it is possible to shorten the parts of the first and second external leads that are exposed from the sealing resin, thereby enabling a reduction in the mounting surface area, and contributing to the reduction in size of the electronic equipment.

In the second aspect of the present invention, it is preferable that the bottom surface of the sealing resin be higher than the lowermost surface of the part of the first and second external leads that extend outside by 0.001 to 0.02 mm. By doing this, it is possible to achieve a good balance between the above-noted effect of the depression and a reduction in the size of the electronic component.

DESCRIPTION OF THE PREFERRED EMBODIMENTS

First Embodiment

Figure 1:
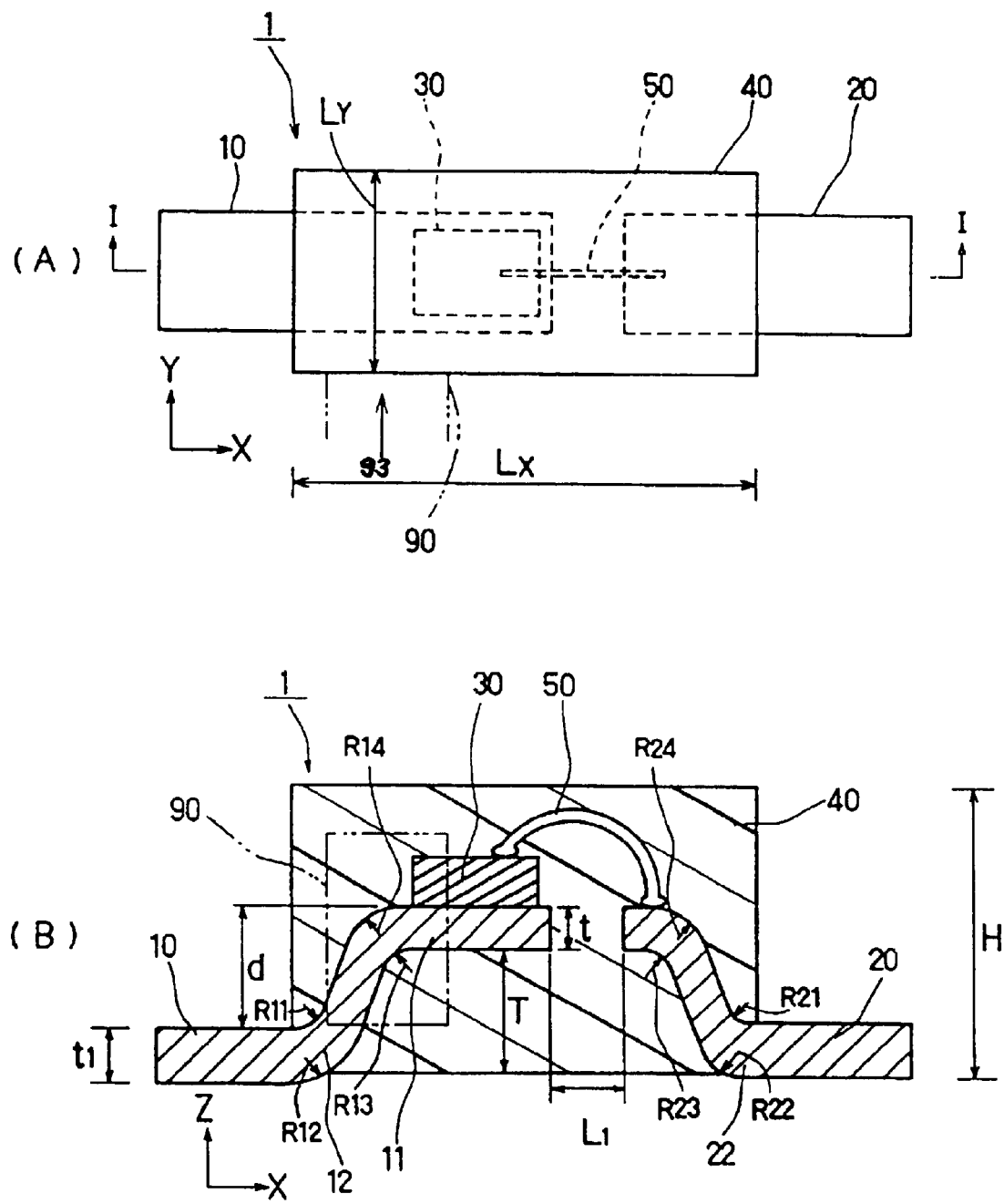
FIG. 1 is a drawing that shows the general construction of an example of the first embodiment of an electronic device according to the present invention, (A) being a plan view thereof, and (B) being a cross-section view thereof, as seen from the direction indicated by the arrows along the line I—I shown in (A).

FIG. 1 shows the general construction of the first embodiment of an electronic device according to the present invention, (A) being a plan view thereof, and (B) being a cross-section view thereof, in the direction indicated by the arrows along the line I—I shown in (A).

As shown in this drawing, an electronic device 1 according to this embodiment has a first external lead 10, which has an element placement pad (die pad) 11, and a second external lead 20, which is disposed at a distance from the element placement pad 11. A semiconductor electronic element 30 is mounted to the element placement pad 11 by means of die bonding or the like. Bonding wires 50 make a connection between an external connection terminal of the electronic element 30 and the second external lead 20. The semiconductor electronic element 30, the element placement pad 11, the inner lead part of the first external lead 10, the inner lead part of the second external lead 20, and the bonding wire 50 are sealed by a sealing resin 40.

As shown in FIG. 1, the first external lead 10 and the second external lead 20 are bent in an S shape (substantially a step shape), with one end of the leads 10 and 20 exposed to the outside of the sealing resin 40, extending in a direction that is substantially parallel to the bottom surface of the sealing resin 40 so as to form outer lead parts respectively.

In this case, the thickness t of the first external lead 10 is less than 0.1 mm. If this thickness t is larger than this, it is not possible to achieve a compact electronic device. In a case in which the thickness of the inner lead part within the sealing resin and the thickness of the outer lead part differ (for example, in the case in which the outer lead part is plated with solder), the thickness t refers to the thickness of the inner lead part.

If the bending depth of the first external lead 10 shown in FIG. 1 is d, it is necessary that the thickness t of the lead satisfy the condition $d \geq t$. If the thickness of the sealing resin on the non-element side of the element placement pad 11 is T, it is necessary that the condition $T<d$ be satisfied. By satisfying these relational conditions, it is possible to make the vertical-direction (X-axis direction) dimension $L_X$ and the height-direction (Z-axis direction) dimension H small.

Figure 3:
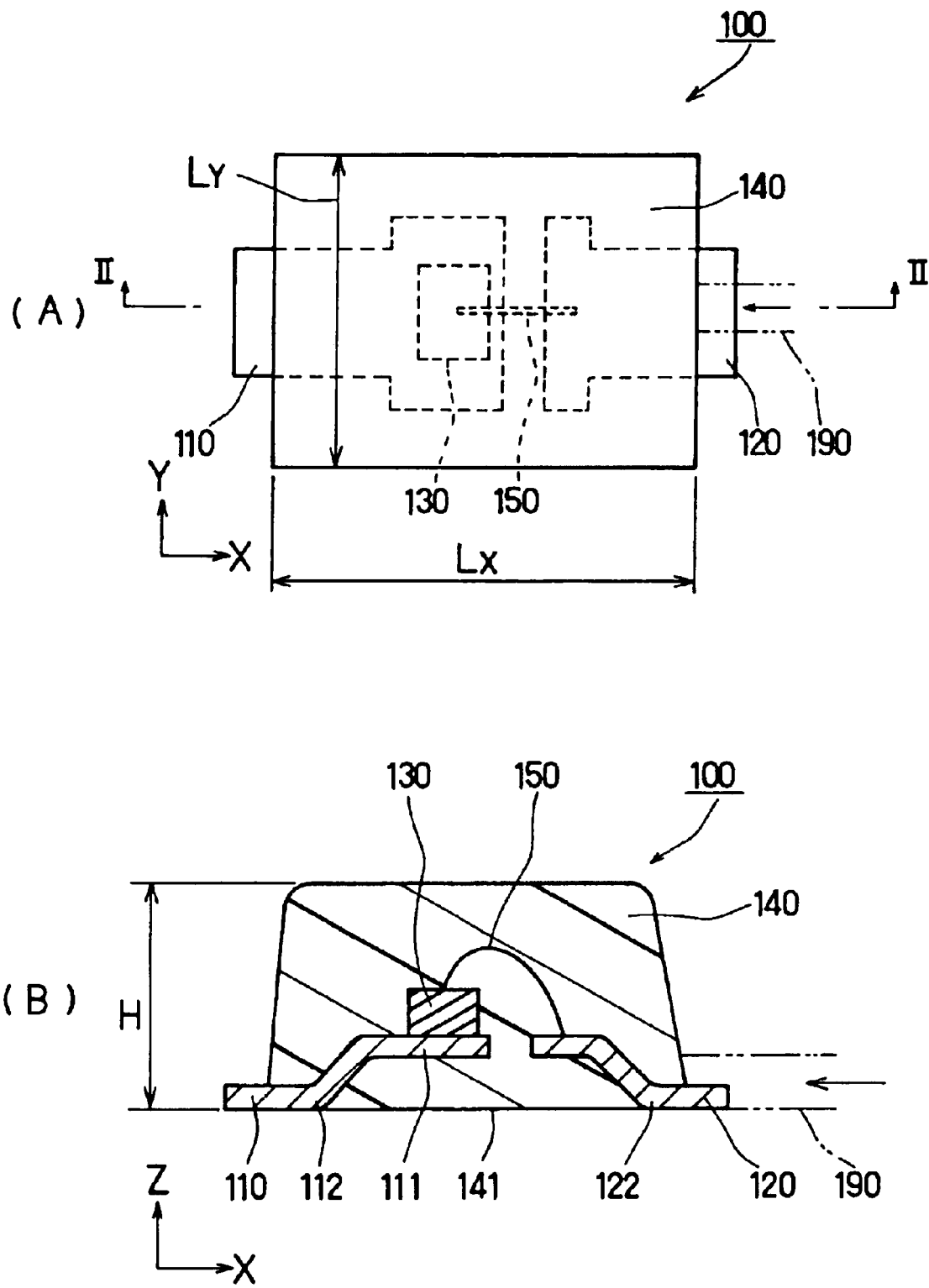
FIG. 3 is a drawing which shows the general construction of an example of a electronic device of the past, (A) being a plan view thereof, and (B) being a cross-section view thereof, as seen from the direction indicated by the arrows along the line II—II shown in (A).

In the above-noted embodiment of an electronic device according to this embodiment, it is preferable that the widths of the inner lead parts of the first external lead and second external leads within the sealing resin be of substantially uniform width and not broaden beyond the widths of the exposed (outer) lead parts. In the past, because thick leads were bent within the resin, externally applied stress caused by cutting of the lead frame or common connection parts during the manufacturing process risked pulled-out leads and damage to the sealing resin. To prevent these problems, therefore, the lead ends of the external leads within the sealing resin were widened (refer to FIG. 3(A)). With this embodiment of the present invention, however, by making the thickness of the leads less than 0.1 mm, it is possible to establish a mechanical balance, thereby enabling the shape (width) of the external lead to be made substantially uniform, without widening in its inner lead part. By doing this, it is possible to reduce the horizontal-direction (Y-axis direction) dimension $L_Y$.

To achieve a balance in strength within the sealed package, it is preferable that the inner lead part thickness t be made substantially the same as the semiconductor element 30 thickness.

Figure 4:
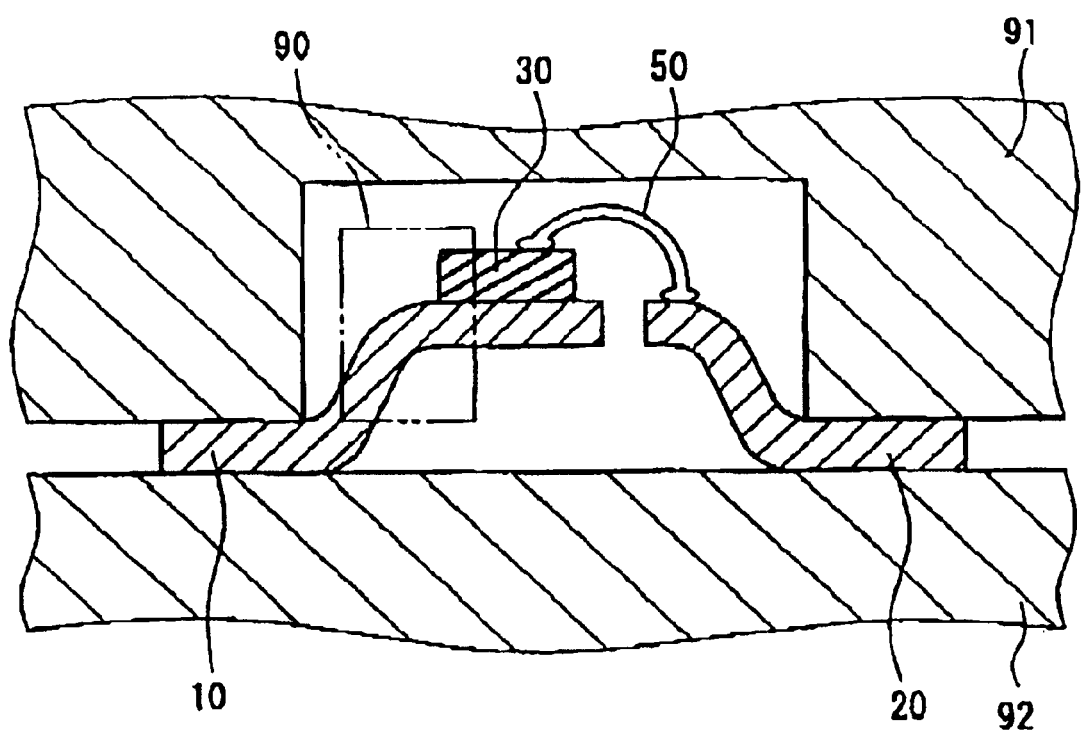
FIG. 4 is a cross-sectional drawing that shows the general construction of an example of the first embodiment of an electronic device according to the present invention.

The position of the sealing resin injection port 90 in this embodiment, as shown by the double-dot-dash line in FIG. 1, and as shown in FIG. 4, is preferably on a longer side of the package, offset from the center thereof towards one of the shorter sides, avoiding the bonding wires 50, with sealing resin being injected therethrough in the direction shown by the arrow 93 in FIG. 1, in order to prevent the bonding wires 50 from toppling by injection pressure of the sealing resin acting on the side surfaces of the bonding wires 50 directly. By making the resin package small, it would be difficult as done in the past to provide a resin injection port on a shorter side of the package. Additionally, because the spacing between the inner wall of the resin die, shown in FIG. 4 as upper die 91 and lower die 92, and the inner lead becomes narrow, it would be difficult to cause resin to sufficiently fill in under the inner lead. For this reason, by injecting sealing resin, as noted above, from a longer side at a position that is offset toward one of the shorter sides of the package, the resin fills into the die smoothly, thereby preventing problems with insufficient resin filling.

It is preferable that the bending radii R at the outer surfaces of the bent part of the inner lead part of the first external lead 10 near the bottom surface of the sealing resin be at least 0.05 mm and no greater than the thickness t of the lead. Specifically, in FIG. 1(B), it is preferable that the bending radii $R_{11}$ and $R_{12}$ of the outer surfaces of the bent part 12 of the first external lead 10 in the region of the bottom surface of the sealing resin be at least 0.05 mm and no greater than the thickness t of the lead. Additionally, it is preferable that the bending radii $R_{13}$ and $R_{14}$ of the outer surfaces of the bent part near the element placement pad 11 of the inner lead part of the first external lead 10 also satisfy the same type of condition. It is further preferable that the outer surface bending radii $R_{21}$, and $R_{22}$ of the bent part 22 of the second external lead 20 near the bottom surface of the sealing resin be at least 0.05 mm and no greater than the thickness of the second external lead. Additionally, it is preferable that the bending radii $R_{23}$ and $R_{24}$ of the outer surfaces of the bent part nearer to the wire bonding end of the inner lead part of the second external lead 20 satisfy the above-noted type of condition. If these conditions are satisfied, it is possible to prevent constriction of material and bending of leads when the leads are formed, as well as to achieve flexibility of the frame with respect to stress that is applied in downstream processes.

A more specific form of the above-noted embodiment is described below.

Using a lead frame having a thickness t of 0.08 mm, with a bending depth d of the first external lead 10 of 0.12 mm and a resin thickness T of 0.11 mm at the bottom of the element placement pad 11, it was possible to place an semiconductor element 30 having a chip size of 0.3 mm square, the spacing $L_1$ between the element placement pad 11 and the second external lead 20 being 0.11 mm. All the bending radii $R_{11}$, $R_{12}$, $R_{13}$, $R_{14}$, $R_{21}$, $R_{22}$, $R_{23}$, and $R_{24}$ on the outer surfaces of the bent parts of the inner lead parts were made 0.05 to 0.1 mm. Under these conditions, the resin package vertical dimension (X-axis direction length in FIG. 1) $L_X$, horizontal dimension (Y-axis direction length in FIG. 1) $L_Y$, and height (Z-axis direction length in FIG. 1) H were 1 mm, 0.5 mm, and 0.5 mm, respectively, this representing an extremely compact package.

An example of a method for manufacturing the above-noted electronic device is described below.

First, a flat lead frame having a thickness of 0.08 mm was punched out and formed with a 0.12 mm depth bend. An element placement pad was formed on the first external lead, and a wire bonding region was formed on the second external lead. Next, the element placement pad was placed on a heater, and die bonding of a semiconductor element was performed while applying heat thereto. Then, the external connection terminal of the semiconductor element was wired to one end of the external lead with bonding wire. After that, the element placement pad, the semiconductor element, and one end of the external leads were sealed using a sealing resin. The resin injection port used to do this was provided on one of the longer sides of the package, offset from the center toward a shorter side. The particle diameter of the filler that was included in the resin was selected as approximately 50 μm or smaller, which was not greater than half of the bending depth d of the leads, so as to improve the filling in of the sealing resin around the bottom parts of the leads.

With a lead thickness t of 0.08 mm, if the lead bending depth d was made shallower than the lead thickness t, it was found that the balance between the thickness of the resin that holds the lead at the bottom part of the lead and the lead strength is disturbed, resulting in a tendency for the package to crack.

It was further discovered that, with a lead thickness t of 0.08 mm, if the lead bending depth d was made larger than 0.13 mm in an attempt to shorten the vertical-direction (X-axis direction) dimension $L_X$, it was difficult to achieve a flat surface on the element placement pad for the purpose of die bonding, making it difficult to make an electronic device any smaller. Thus, it was found to be preferable to establish the depth d as no greater than 0.13 mm under above condition.

Next, solder plating was done on the outer lead part of the first external lead, having an element placement pad, and the outer lead part of the second external lead. Although this can result in a case in which the external lead thickness after solder plating exceeds 0.1 mm, this presents no problem. Finally, the lead frame was cut at a length of 0.2 mm from the outer edge of the resin package, thereby completing the device.

Second Embodiment

Figure 2:
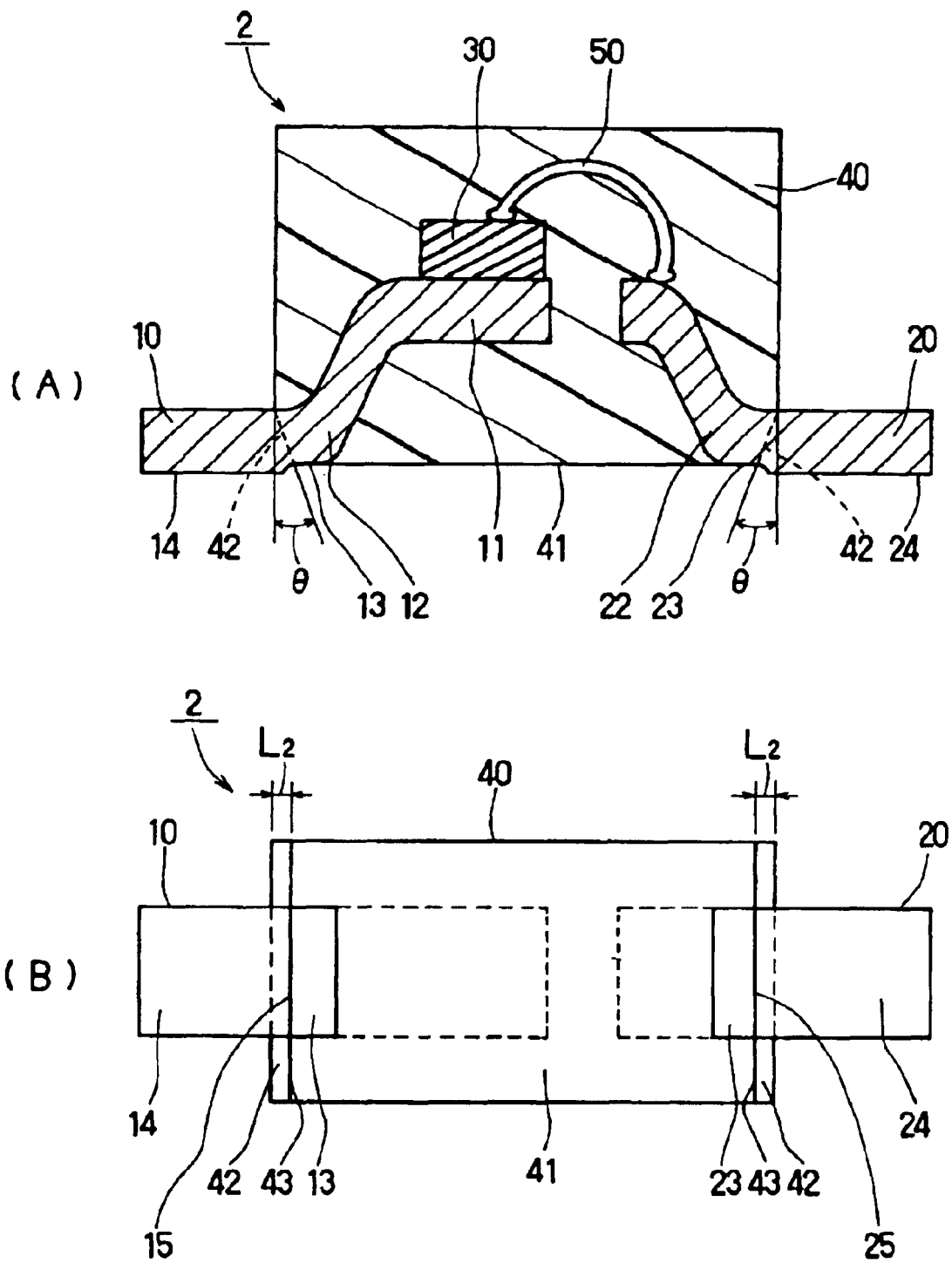
FIG. 2 is a drawing that shows the general construction of an example of the second embodiment of an electronic device according to the present invention, (A) being a cross-section view thereof, and (B) being a bottom view thereof.

FIG. 2 shows the general construction of the second embodiment of an electronic device according to the present invention, (A) being a cross-section view thereof, and (B) being a bottom view thereof.

Elements in the second embodiment that have the same function as those in the first embodiment have been assigned the same reference numerals, and will not be described in detail herein.

In the second embodiment of an electronic device according to this embodiment, depressions 13 and 23, respectively, are formed on the lower surfaces of the bent parts 12 and 22 of the first external lead 10 and the second external lead 20, near the bottom surface 41 of the sealing resin 40. The depressions 13 and 23 are formed by coining or the like, and the thicknesses of the leads 10 and 20 near the parts at which the depressions 13 and 23 are formed are thinner than the thicknesses of the inner lead parts. The lower surfaces of the depressions 13 and 23 and the bottom surface 41 of the sealing resin 40 are formed so as to be higher than the lowermost surface 14 of the outer lead part of the first external lead 10 and the lowermost surface 24 of the outer lead part of the second external lead 20.

It is preferable that the height of the lower surface of the depressions 13 and 23 and the height of the bottom surface 41 of the sealing resin 40 be made 0.001 to 0.02 mm higher than the lowermost surfaces 14 and 24 of the outer lead parts, and further preferable that the increase in height be no greater than 0.01 mm. By making the height of the lower surface of the depressions 13 and 23 and the height of the bottom surface 41 of the sealing resin 40 in the above mentioned range, good adhesion and filling of solder to the outer lead parts is achieved when mounting the device to a circuit board. If the height of the bottom surface 41 of the sealing resin 40 is made greater than the above-noted upper limit, the resin layer on the bottom side of the element placement pad 11 becomes thin, so that an attempt to achieve the required resin thickness results in a higher resin package. If the lower surfaces of the depressions 13 and 23 are made higher than the above-noted range, the part of the lead at which the depression is formed will become excessively thin, resulting in a loss of lead strength. From the standpoint of lead strength, the thickness of the lead at the part at which the depression is formed is preferably no less than 90% of the thickness of the inner lead part. While there is no need for the lower surface of the depressions 13 and 23 to be formed in the same plane as the bottom surface 41 of the sealing resin 40, forming these on the same plane is preferable, as it facilitates the design of the resin die.

By providing the depressions 13 and 23 in this manner on bent parts 12 and 22 of the leads, the angle that the lower lead surface makes with respect to the sealing resin bottom surface 41 at the lead bent parts 12 and 22 near the bottom surface 41 of the sealing resin 40, that is, the angle of rise of the inner leads with respect to the sealing resin bottom surface 41, becomes large. For this reason, the thin part of the sealing resin under the inner lead parts in the region of the bottom surface 41 of the sealing resin is reduced. The result is that sealing resin filling in around the lead bent parts 12 and 22 is good, and the forming of the sealing resin bottom surface is stabilized in the area surrounding the bent parts 11 and 22. There is therefore an improvement in the adhesion strength between the leads and the sealing resin, in addition to an improvement in the strength of the leads themselves.

It is preferable that the depressions 13 and 23 be formed inside of the outer peripheral edge of the resin package, as viewed from either the top or the bottom. By adopting this configuration, if the design is made such that the surface of the die used for resin sealing that will be the bottom surface 41 of the sealing resin 40 is on the same plane as the depressions 13 and 23, it is possible easily to prevent the leakage of resin from the area surrounding the depressions when resin is injected into the die. Because the formation of the depressions is accompanied by a reduction in the lead thickness, by forming the depressions within the above-noted region, it is possible to support the entire part in which the thickness is reduced with sealing resin, and to prevent a loss of lead strength. Additionally, because it is possible to form the lowermost surfaces of the first and second external leads within the projected boundaries of the sealing resin as seen from above, i.e. within the peripheral edges of the resin package, it is possible to achieve a sufficient contact surface area between the circuit board and the first and second external leads, even if the exposed parts of the first and second external leads are shortened. It is therefore possible to reduce the mounting surface area of the electronic component, thereby contributing to a reduction in size of the overall electrical equipment.

In general, to facilitate removal from the die used for resin sealing after injection of the sealing resin, an escape part with predetermined inclination angle with respect to the abutted surfaces of the top and bottom parts of the die is provided in the die. In this embodiment of the present invention, it is preferable, as shown in FIG. 2(B), to form the bottom edge position 43 of the escape part 42, which has an angle of $\theta$ and is formed on the bottom of the exposed-lead side of the sealing resin, so that the bottom edge position 43 is substantially the same position as the forming edges 15 and 25 of the depressions 13 and 23. By doing this, the depressions 13 and 23 are formed inside of the outer peripheral edge of the resin package, thereby achieving the above-noted effect.

It is preferable that the distance $L_2$ from the outer peripheral edge of the resin package to the bottom edge position 43 of the escape part 42 and to the forming edges 15 and 25 of the depressions 13 and 23 be no greater than the lead thickness. If the distance $L_2$ is greater than the above-noted limit, it not possible to achieve a sufficient region for use as the element placement pad 11, and an attempt to achieve a sufficiently sized element placement pad 11 will result in an increase in the size of the resin package, an increase in the bending angle of the leads, or the need to make the thickness T of the layer of resin under the element placement pad 11 thin.

The outer lead parts can be plated after sealing with resin, and the accompanying increase in thickness does not cause a problem.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing an electronic device comprising:

placing within a die a first lead with an element placement pad having a thickness t of less than 0.1 mm, a second lead that is disposed at a distance from said element placement pad, and an electronic element placed on said element placement pad; and sealing in a package said electronic element, said element placement pad, a part of said first lead, and a part of said second lead by injecting a sealing resin, in a direction substantially parallel to a surface of said element placement pad, in the die from a position on a longer side of the package, said position being offset toward one shorter side thereof;

wherein a portion of said first lead is bent in a substantially S shape, the S shape portion is substantially confined within the package, a first end of the S shape extends to the element placement pad to mount the electronic element and a portion of a second end of the S shape extends partially outside the package, a bending depth d being at least as large as the thickness t of said first lead, and a thickness T of said resin on a non-device side of said element placement pad is smaller than said bending depth d.

2. The method according to claim 1, wherein the spacing between said element placement pad and said second lead is no greater than 0.12 mm.

3. The method according to claim 1, wherein the vertical, horizontal and height outer dimensions of said sealing resin are each no greater than 1.0 mm.

4. The method according to claim 1, wherein widths of inner lead parts of said first and second leads within said sealing resin are substantially uniform.

5. The method according to claim 1, wherein the thickness of said electronic element is substantially the same as the thickness t of said first lead.

6. The method according to claim 1, wherein a bending radius R on an outer surface of a bent part of said first lead near a bottom surface of said sealing resin is at least 0.05 mm and is no greater than the lead thickness t.

7. The method according to claim 1, wherein the sealing resin contains a filler, whose particle diameter is not greater than half the bending depth d of the said first lead.

* * * * *